(12) United States Patent
Katou et al.

(10) Patent No.: US 11,041,239 B2
(45) Date of Patent: Jun. 22, 2021

(54) FILM FORMING METHOD FOR SIC FILM

(71) Applicant: TOKYO ELECTRON LIMITED, Tokyo (JP)

(72) Inventors: Taiki Katou, Nirasaki (JP); Shuji Azumo, Nirasaki (JP); Yusaku Kashiwagi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/467,746

(22) PCT Filed: Nov. 16, 2017

(86) PCT No.: PCT/JP2017/041237
§ 371 (c)(1),
(2) Date: Jun. 7, 2019

(87) PCT Pub. No.: WO2018/105349
PCT Pub. Date: Jun. 14, 2018

(65) Prior Publication Data
US 2020/0063262 A1 Feb. 27, 2020

(30) Foreign Application Priority Data
Dec. 9, 2016 (JP) .............................. JP2016-239716

(51) Int. Cl.
| | |
|---|---|
| *C23C 16/455* | (2006.01) |
| *C23C 16/32* | (2006.01) |
| *H01L 21/02* | (2006.01) |
| *C23C 16/458* | (2006.01) |

(52) U.S. Cl.
CPC ...... *C23C 16/45553* (2013.01); *C23C 16/325* (2013.01); *C23C 16/4586* (2013.01); *C23C 16/45534* (2013.01); *C23C 16/45536* (2013.01); *H01L 21/0228* (2013.01); *H01L 21/02167* (2013.01); *H01L 21/02274* (2013.01)

(58) Field of Classification Search
None
See application file for complete search history.

(56) References Cited

U.S. PATENT DOCUMENTS

| | | | | |
|---|---|---|---|---|
| 2014/0193983 A1* | 7/2014 | LaVoie | .............. | C23C 16/45525 438/778 |
| 2017/0342559 A1* | 11/2017 | Fukazawa | ............. | C23C 16/325 |
| 2019/0055645 A1* | 2/2019 | Li | ..................... | H01L 21/02274 |

FOREIGN PATENT DOCUMENTS

| | | |
|---|---|---|
| JP | 2000-306992 A | 11/2000 |
| KR | 1020140090964 A | 7/2014 |
| WO | 2016/031563 A1 | 3/2016 |

OTHER PUBLICATIONS

Sato, A. Uchiyama, T. Ode, S. Shimazu, T. Uematsu, K. Kojima, T. Hirano, and H. Koinuma, J. Chem. Soc. Jpn. 5, 531 (1990) (Year: 1990).*

* cited by examiner

*Primary Examiner* — Jose I Hernandez-Kenney
(74) *Attorney, Agent, or Firm* — Nath, Goldberg & Meyer; Jerald L. Meyer; Tanya E. Harkins (57) ABSTRACT

A method for forming a SiC film on a target substrate by ALD, comprises: activating a surface of the target substrate by activation gas plasma which is plasmatized an activation gas; and forming a SiC film by supplying a source gas containing a precursor represented by a chemical formula $RSiX^1_3$ or $RSiHClX^2$ onto the target substrate whose the surface is activated by activating the surface of the target substrate, where, R is an organic group having an unsaturated bond, $X^1$ is selected from a group consisting of H, F, Cl, Br and I, and $X^2$ is one selected from a group consisting of Cl, Br and I.

2 Claims, 11 Drawing Sheets

FILM FORMING METHOD FOR SIC FILM

CROSS-REFERENCE TO RELATED APPLICATION

This is a National Phase Application filed under 35 U.S.C. 371 as a national stage of PCT/JP2017/041237, filed Nov. 16, 2017, an application based upon and claims priority from the benefit of Japanese Patent Application No. 2016-239716, filed on Dec. 9, 2016, the entire contents of which are hereby incorporated herein by reference.

TECHNICAL FIELD

The present disclosure relates to a method for forming a SiC film on a target substrate.

BACKGROUND

In a process of manufacturing a semiconductor device, a film is buried in an opening such as a trench, a hole or the like formed in a surface of a semiconductor substrate for various purposes. For example, Patent Document 1 discloses a technique in which a silicon oxide film or a silicon nitride film is buried in a trench to isolate elements from each other. As another example, Patent Document 2 discloses a technique in which a polysiloxane composition film is buried in a hole in order to inverse a hole pattern.

In the meantime, with recent miniaturization of semiconductor devices, there is a desire to provide a silicon carbide (SiC) film as the above-mentioned buried film in the opening.

Various methods have conventionally been used to form a SiC film. For example, in a CVD (Chemical Vapor Deposition) method, while heating a substrate on which a film is to be formed, by supplying source gas, such as a carbon-containing gas and a silicon-containing gas or the like, into a reaction chamber and thermally decomposing the carbon-containing gas and the silicon-containing gas to cause these gases to react with each other on the substrate, a SiC film is formed on the substrate.

In addition, for example, an ALD (Atomic Layer Deposition) method, while heating a substrate on which a film is to be formed, by repeating a cycle including supplying a silicon-containing precursor into a reaction chamber, purging an interior of the reaction chamber, supplying a carbon-containing precursor into the reaction chamber, and purging the interior of the reaction chamber, atomic layers are deposited one by one to form an SiC film on the substrate.

PRIOR ART DOCUMENTS

Patent Documents

Patent Document 1: Japanese patent publication No. 2000-306992
Patent Document 2: International Publication WO2016/031563

When a device is formed on a substrate on which a film is to be formed, in order to protect the device, a film forming process at a low temperature of, for example, 400 degrees C. or less is required. However, in the above-described conventional CVD method or ALD method, since the film forming process is performed at a high temperature of 700 degrees C. to 1,000 degrees C., or more, there is a possibility of damage to the device on the substrate.

In this manner, a method for appropriately forming a SiC film has not yet been established.

The present disclosure provides embodiments of a technique for appropriately forming a SiC film on a target substrate.

SUMMARY

As a result of intensive investigation by the present inventors, it has been found that a SiC film can be formed even at a low temperature by activating a surface of a target substrate (i.e., a to-be processed substrate) by activation gas plasma and thereafter supplying a source gas containing a precursor having a specific structure.

The present disclosure has been made on the basis of the above finding, and according to one embodiment of the present disclosure, there is provided a method for forming a SiC film on a target substrate by ALD, including: activating a surface of the target substrate by activation gas plasma which is obtained by plasmarizing an activation gas; and forming a SiC film by supplying a source gas containing a precursor represented by a chemical formula $RSiX^1_3$ or $RSiHClX^2$ onto the target substrate whose the surface is activated. In the chemical formula, R is an organic group having an unsaturated bond, $X^1$ is selected from a group consisting of H, F, Cl, Br and I, and $X^2$ is selected from a group consisting of Cl, Br and I.

According to another embodiment of the present disclosure, there is provided a method for forming a SiC film on a target substrate by thermal CVD, including: forming a SiC film by supplying a source gas containing a precursor having a 3-membered ring formed by at least one C atom and at least one Si atom onto the target substrate.

According to the present disclosure, it is possible to appropriately form a SiC film on a target substrate.

DETAILED DESCRIPTION

Embodiments of the present disclosure will now be described with reference to the drawings. Throughout the present specification and the drawings, constituent elements having substantially the same functional configuration are denoted by the same reference numerals and explanation thereof will not be repeated.

First Embodiment

Figure 1:
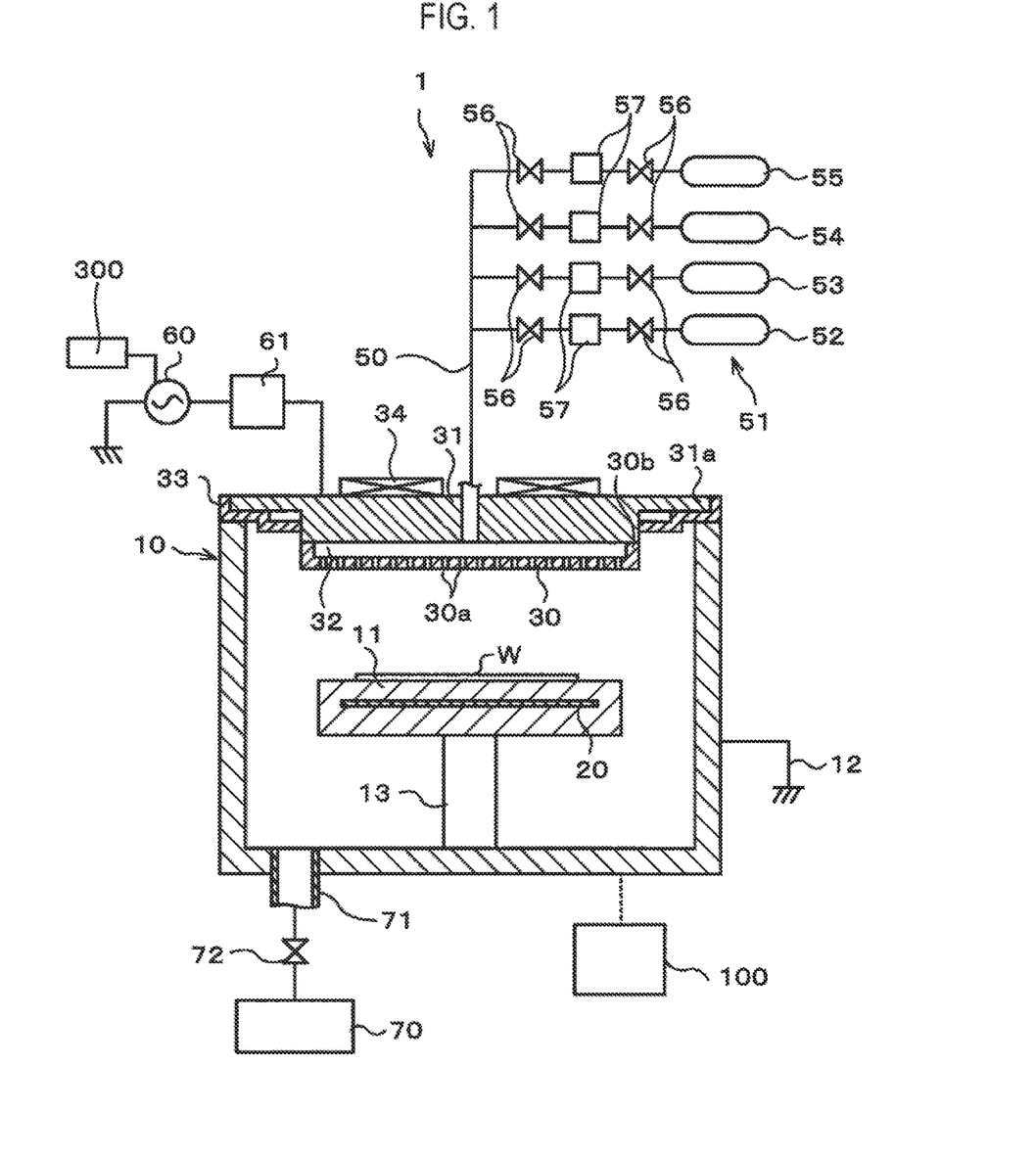
FIG. 1 is a longitudinal sectional view schematically showing a film forming apparatus according to a first embodiment of the present disclosure.
Figure 2A:
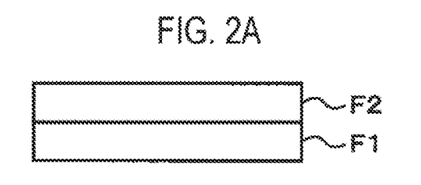
FIGS. 2A to 2C are views showing an example of a substrate on which a film is to be formed by the film formation apparatus of FIG. 1.
Figure 2B:
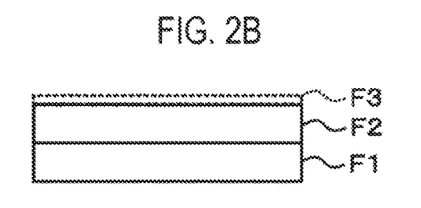
Figure 2C:
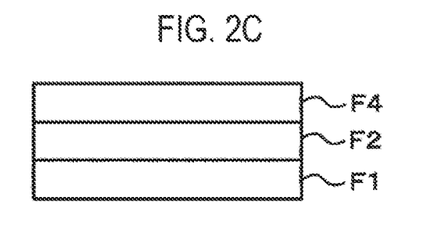

FIG. 1 is a longitudinal sectional view schematically showing a film forming apparatus according to a first embodiment of the present disclosure. FIGS. 2A to 2C are views showing an example of a substrate on which a film is to be formed by the film formation apparatus of FIG. 1.

The film forming apparatus 1 of FIG. 1 forms a SiC film on a substrate W as a target substrate (i.e., a to-be processed substrate) using an ALD method, more specifically, a plasma enhanced ALD (PEALD) method. The substrate W is a substrate including an underlying film F2 such as a tungsten film or a silicon oxide film ($SiO_2$ film) formed on a semiconductor substrate F1, as shown in FIG. 2A, and further including a SiC monolayer film F3 that is formed on the underlying film F2, as shown in FIG. 2B. The film forming apparatus 1 performs a film forming process on the SiC monolayer film F3, thereby forming a SiC film F4 having a predetermined thickness on the underlying film F2, as shown in FIG. 2C.

This film forming apparatus 1 includes a substantially cylindrical processing container 10 having a bottom and an opened top, and a mounting table 11 provided in the processing container 10 for mounting the substrate W thereon. The processing container 10 is electrically connected to a grounding wire 12 and is grounded. The inner wall of the processing container 10 is covered with a liner (not shown) having, on its surface, a thermal sprayed coating made of a plasma-resistant material.

The mounting table 11 is made of ceramics such as aluminum nitride (AlN) or the like, and has, on its surface, a coating (not shown) made of a conductive material. The lower surface of the mounting table 11 is supported by a support member 13 made of a conductive material, and the mounting table 11 and the support member 13 are electrically connected. The lower end of the support member 13 is supported by the bottom surface of the processing container 10 and is electrically connected to the processing container 10. Therefore, the mounting table 11 is grounded via the processing container 10 and functions as a lower electrode forming a pair with an upper electrode 30 to be described later. The lower electrode is not limited in its configuration to the contents of this embodiment, but may have, for example, a configuration in which a conductive member such as a metal mesh is buried in the mounting table 11.

The mounting table 11 incorporates an electric heater 20 which may heat the substrate W mounted on the mounting table 11 to a predetermined temperature. The mounting table 11 is further provided with a clamp ring (not shown) which presses the outer peripheral portion of the substrate W to fix the substrate W on the mounting table 11, and lift pins (not shown) for delivering the substrate W between a transfer mechanism (not shown) provided outside the processing container 10 and the processing container 10.

A substantially disc-shaped upper electrode 30 is provided on the inner surface of the processing container 10 above the mounting table 11 serving as the lower electrode, to face the mounting table 11 in parallel. In other words, the upper electrode 30 is disposed to face the substrate W mounted on the mounting table 11. The upper electrode 30 is made of conductive metal such as nickel (Ni) or the like.

A plurality of gas supply holes 30a penetrating the upper electrode 30 in the thickness direction is formed in the upper electrode 30. A protrusion 30b protruding upward is formed on the entire circumference of the outer peripheral edge of the upper electrode 30. That is, the upper electrode 30 has a substantially cylindrical shape with a bottom and an opened top. The upper electrode 30 has a diameter which is smaller than the inner diameter of the processing container 10 such that the outer surface of the protrusion 30b is separated by a predetermined distance from the inner surface of the processing container 10, and is larger than the substrate W such that a surface of the upper electrode 30 facing the mounting table 11 covers the entire surface of the substrate W on the mounting table 11 when viewed from top. A substantially disc-shaped lid 31 is connected to the upper end surface of the protrusion 30b, and a gas diffusion chamber 32 is formed by a space surrounded by the lid 31 and the upper electrode 30. Like the upper electrode 30, the lid 31 is also made of conductive metal such as nickel. Further, the lid 31 and the upper electrode 30 may be integrally formed.

A locking part 31a protruding outward of the lid 31 is formed on the outer peripheral portion of the upper surface of the lid 31. The lower surface of the locking part 31a is held by an annular support member 33 supported by the upper end portion of the processing container 10. The support member 33 is made of an insulating material such as quartz or the like. Therefore, the upper electrode 30 and the processing container 10 are electrically isolated from each other. An electric heater 34 is provided on the upper surface of the lid 31. The electric heater 34 may heat the lid 31 and the upper electrode 30 connected to the lid 31 to a predetermined temperature.

A gas supply pipe 50 is connected to the gas diffusion chamber 32 through the lid 31. As shown in FIG. 1, a process gas supply source 51 is connected to the gas supply pipe 50. A process gas supplied from the process gas supply source 51 is supplied into the gas diffusion chamber 32 via the gas supply pipe 50. The process gas supplied into the gas diffusion chamber 32 is introduced into the processing container 10 via the gas supply holes 30a. In this case, the upper electrode 30 functions as a shower plate for introducing the process gas into the processing container 10.

The process gas supply source 51 in this embodiment includes a source gas supply part 52 for supplying a gas containing vinyltrichlorosilane as a precursor as a source gas for forming a SiC film, an activation gas supply part 53 for supplying an activation gas for activating the surface of the substrate W, for example, a hydrogen ($H_2$) gas, and a rare gas supply part 54 for supplying a rare gas for plasma generation. As a rare gas supplied from the rare gas supply part 54, for example, an argon (Ar) gas may be used. The process gas supply source 51 further includes a purge gas supply part 55 for supplying a nitrogen ($N_2$) gas for purge. The process gas supply source 51 further includes valves 56 and flow rate regulation mechanisms 57 provided between the gas supply parts 52, 53, 54 and 55 and the gas diffusion chamber 32, respectively. The flow rates of gases supplied into the gas diffusion chamber 32 are controlled by the respective flow rate regulation mechanisms 57.

A high frequency power supply 60 for generating plasma by supplying high frequency power to the upper electrode 30 through the lid 31 is electrically connected to the lid 31 via a matching device 61. The high frequency power supply 60 is configured to output high frequency power having a frequency of, for example, 100 kHz to 100 MHz. The matching device 61 matches the internal impedance of the high frequency power supply 60 with the load impedance. The matching device 61 serves to apparently match the internal impedance of the high frequency power supply 60 with the load impedance when plasma is generated in the processing container 10.

An exhaust mechanism 70 for exhausting the interior of the processing container 10 is connected to the bottom surface of the processing container 10 via an exhaust pipe 71. The exhaust pipe 71 is provided with a regulating valve 72 for regulating the amount of exhaust by the exhaust mechanism 70. Therefore, the exhaust mechanism 70 may be driven to exhaust the internal atmosphere of the processing container 10 via the exhaust pipe 71 so that the interior of the processing container 10 may be depressurized to a predetermined degree of vacuum.

The film forming apparatus 1 described above is provided with a control part 100. The control part 100 is, for example, a computer and has a program storage part (not shown). The program storage part stores a program for controlling various components such as the electric heater 20 and 34, the flow rate regulation mechanisms 57, the high frequency power supply 60, the matching device 61, the exhaust mechanism 70, the regulating valve 72 and the like to operate the film forming apparatus 1.

The program is recorded on a computer-readable storage medium such as a computer-readable hard disk (HD), flexible disk (FD), compact disk (CD), magneto-optical disk (MO), memory card or the like and may be installed in the control part 100 from the storage medium.

Figure 3:
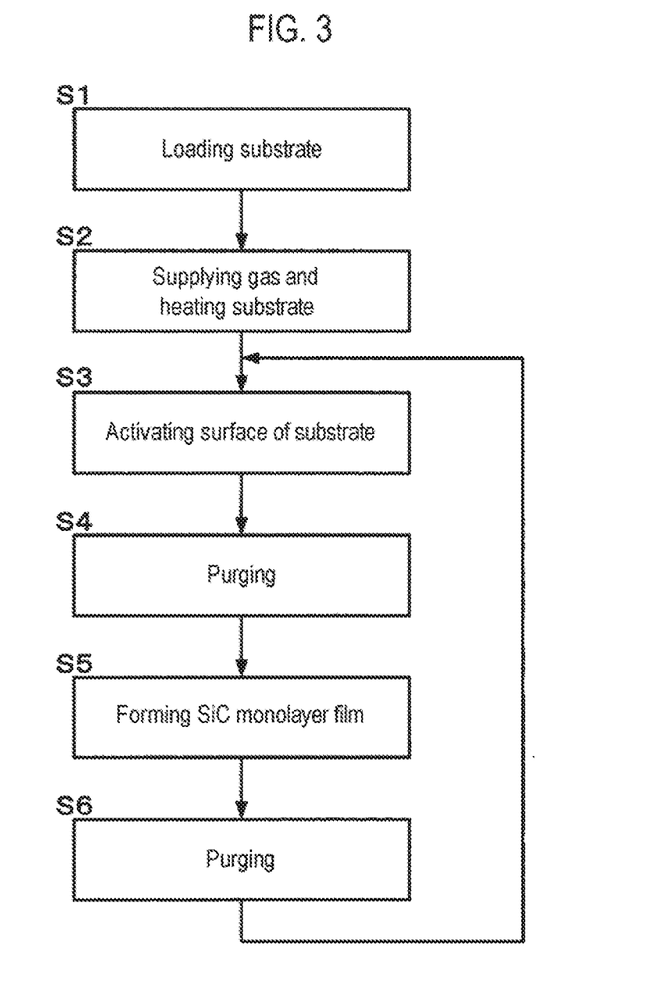
FIG. 3 is a flowchart for explaining a film forming process in the film forming apparatus of FIG. 1.
Figure 4:
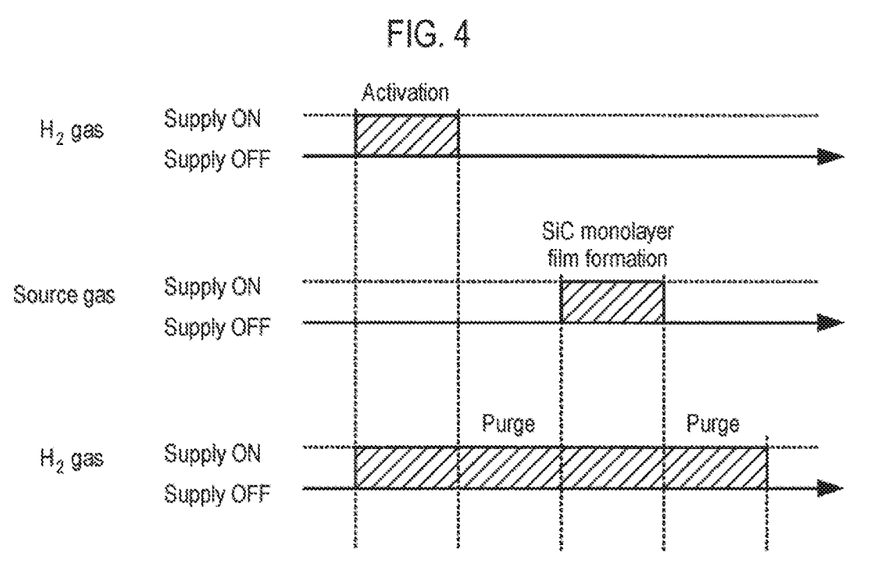
FIG. 4 is a timing chart for explaining the film forming process in the film forming apparatus of FIG. 1.

The film forming apparatus 1 according to the present embodiment is configured as described above. Next, a process of forming a SiC film on the substrate W in the film forming apparatus 1 according to the present embodiment will be described. FIGS. 3 and 4 are a flowchart and a timing chart, respectively, for explaining the film forming process in the film forming apparatus 1.

In the film forming process, first, as shown in FIG. 3, the substrate W is loaded into the processing container 10 and mounted and held on the mounting table 11 (step S1). When the substrate W is held on the mounting table 11, the interior of the processing container 10 is exhausted and kept airtight by the exhaust mechanism 70. At the same time, supply of gases and heating of the substrate W are started (step S2).

Specifically, a $H_2$ gas, an Ar gas and a $N_2$ gas are supplied from the process gas supply source 51 into the processing container 10 at their respective predetermined flow rates. In this time, the respective flow rate regulation mechanisms 57 are controlled such that the flow rate of $H_2$ gas becomes about 1 to 10,000 sccm, the flow rate of Ar gas becomes about 1 to 1,000 sccm, and the flow rate of $N_2$ gas becomes about 1 to 1,000 sccm. Further, the opening degree of the regulating valve 72 is controlled such that the internal pressure of the processing container 10 becomes, for example, 13 to 1,330 Pa.

The upper electrode 30 and the substrate W on the mounting table 11 are heated and maintained, for example, at 400 degrees C. by the respective electric heaters 20 and 34.

Next, the surface of the substrate W is activated (step S3). Specifically, the high frequency power supply 60 applies high frequency power to the upper electrode 30. Thereby, the $H_2$ gas supplied into the processing container 10 is plasmarized between the upper electrode 30 and the mounting table 11 functioning as the lower electrode, and plasma is generated by H radicals and Ar radicals. Then, the surface of the substrate W is activated by plasma of H radicals, that is, the activated plasma.

After completion of this activation, the application of high frequency power to the upper electrode 30 by the high frequency power supply 60 is stopped. At the same time, as shown in FIG. 4, with the supply of $N_2$ gas maintained, the supply of $H_2$ gas and Ar gas is stopped and the interior of the processing container 10 is purged with the $N_2$ gas (step S4).

After the purging, a new SiC monolayer film is formed (step S5). Specifically, after the purging, as shown in FIG. 4, with the supply of $N_2$ gas maintained, a source gas containing vinyltrichlorosilane as a precursor is supplied into the processing container 10. At this time, the respective flow rate regulation mechanisms 57 are controlled so that the flow rate of the source gas becomes about 1 to 100 sccm and the flow rate of the $N_2$ gas is about 1 to 10,000 sccm. Further, the opening degree of the regulating valve 72 is controlled so that the internal pressure of the processing container 10 becomes, for example, 13 to 1,330 Pa.

After the new SiC monolayer film is formed, as shown in FIG. 4, with the supply of $N_2$ gas maintained, the supply of source gas is stopped and the interior of the processing container 10 is purged with the $N_2$ gas (step S6).

By repeating the operation of steps S3 to S6, a SiC film having a predetermined film thickness may be formed on the underlying film of the substrate W.

Upon completion of the film forming process on the substrate W, the substrate W is unloaded from the processing container 10. Then, a new substrate W is loaded into the processing container 10 and the film forming process on this series of substrates W is repeatedly performed.

As described above, in the present embodiment, when forming a SiC film at a low temperature using an ALD method, the SiC film is formed on the surface of the substrate W by (1) activating the surface of the substrate W with plasma of H radicals and (2) supplying a vinyltrichlorosilane gas as a source gas onto the substrate W whose surface is activated. This method is based on the findings by simulation analysis performed by the present inventors.

The present inventors have first investigated through a simulation whether or not a SiC film can be formed on a substrate W at a low temperature using an ALD method in a state where the surface of the substrate W of the low temperature is not activated, by using one of a SiC-based molecule containing a straight-chain unsaturated bond, a SiC-based molecule containing a many-membered ring structure, and a normal straight-chain SiC-based molecule containing neither unsaturated bond nor many-membered ring structures, as a precursor.

Figure 5:
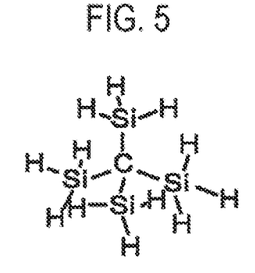
FIG. 5 is an explanatory view of a simulation performed by the present inventors.

FIG. 5 is an explanatory view of a simulation performed by the present inventors. In order to investigate whether or not it is possible to form the SiC film, the present inventors calculated the energy necessary for bonding the surface of the SiC substrate and the above-mentioned precursor by simulation. In a simulation on the surface reaction of the following SiC substrate including this simulation, the surface of the SiC substrate is represented by a structure (CSi—H structure) where silicon (Si) atoms bonded to a carbon (C) atom are terminated with H, as shown in FIG. 5.

Figure 6:
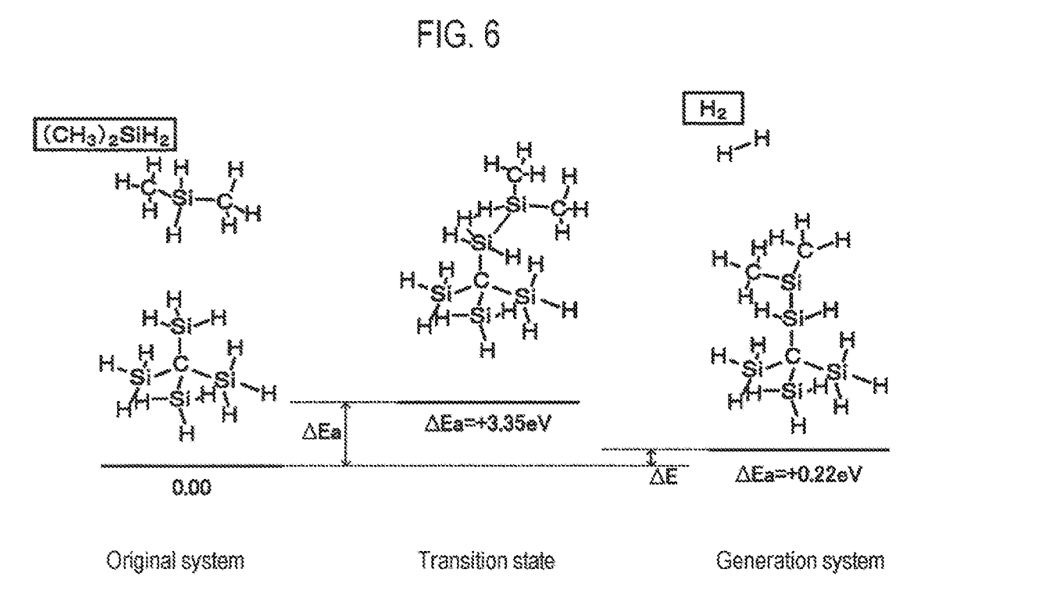
FIG. 6 is a view showing an energy required to bond a precursor to a surface of a SiC substrate when the surface is not activated.

FIG. 6 is a view for explaining an energy necessary for bonding the precursor to the surface of the SiC substrate when the surface of the SiC substrate is not activated.

In the case where the SiC substrate is not subjected to surface treatment, that is, in the case where it is not activated, as shown in the figure, it is necessary to go through a transition state by using dimethylsilane (($CH_3)_2SiH_2$), which is the above normal straight-chain SiC-based molecule, as a precursor in order to bond/adsorb the precursor to the surface of the SiC substrate. The activation energy required to go from the original system to the transition state, that is, the energy required to bond the precursor to the SiC substrate surface, is 3.35 eV. However, this energy is much higher than 0.75 eV which is a threshold value required to obtain the surface reaction at the substrate temperature of 400 degrees C., i.e. a threshold value required to form a SiC film by an ALD method at the substrate temperature of 400 degrees C.

The same applies to a case where a SiC-based molecule containing a straight-chain unsaturated bond or a SiC-based molecule containing a many-membered ring structure is used as the precursor.

Therefore, it is considered that it is necessary to activate the SiC substrate surface in order to form the SiC film using the above-mentioned precursor.

Next, the present inventors have investigated whether or not the SiC substrate surface can be activated by using plasma of H radicals as activation gas plasma.

Figure 7:
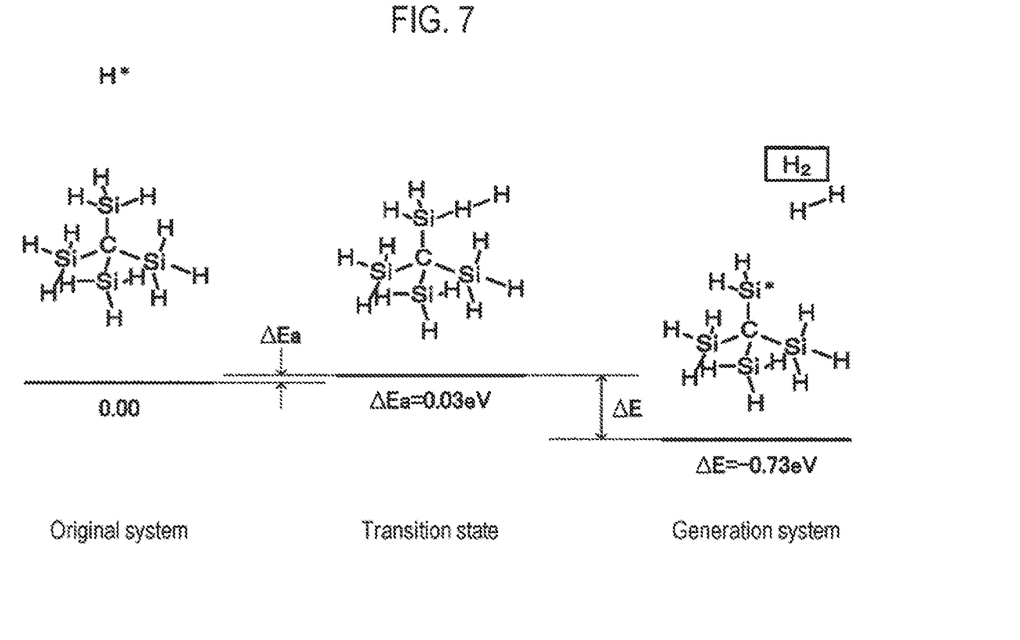
FIG. 7 is a view showing an energy required to activate a SiC surface.

FIG. 7 is a view showing an energy required to activate the SiC substrate surface.

As shown in the figure, in order to activate the SiC substrate surface by using plasma of H radicals, specifically, in order to form a Si dangling bond on the SiC substrate surface, it is necessary to go through a transition state. The activation energy required to go to the transition state, that is, the energy required to activate the SiC substrate surface by the plasma of H radicals, is 0.03 eV. This energy is much lower than 0.75 eV which is a threshold value required to obtain the surface reaction at the substrate temperature of 400 degrees C.

Therefore, it is possible to activate the SiC substrate surface at 400 degrees C. by using the plasma of H radicals.

Next, the present inventors have investigated whether or not a SiC film can be formed on the activated SiC substrate surface by using one of a SiC-based molecule containing a straight-chain unsaturated bond, a SiC-based molecule containing a many-membered ring structure and a normal straight-chain SiC-based molecule containing neither unsaturated bond nor many-membered structure, as a precursor.

Figure 8:
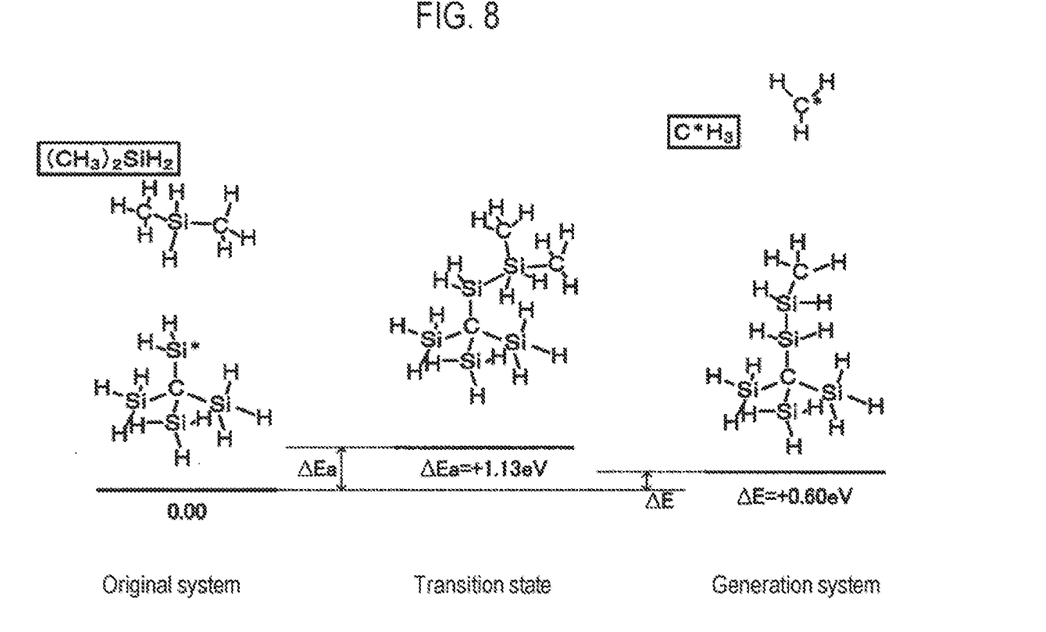
FIG. 8 is a view showing an energy required to bond a normal straight-chain molecule as a precursor to the activated SiC substrate surface.

FIG. 8 is a view for explaining an energy required to bond the above-mentioned normal SiC-based molecule as a precursor to the activated SiC substrate surface.

It is necessary to go through a transition state by using dimethylsilane, which is the above normal straight-chain SiC-based molecule, as a precursor in order to bond/adsorb the precursor to the activated SiC substrate surface. The activation energy required to go from the original system to the transition state, that is, the energy required to bond the precursor to the SiC substrate surface, is 1.13 eV. However, this energy is higher than 0.75 eV which is a threshold value required to form a SiC film by an ALD method at the substrate temperature of 400 degrees C. Therefore, it is considered that it is difficult to form the SiC film using dimethylsilane.

However, there is a possibility that dimethylsilane radicals obtained by activating dimethylsilane by the surface reaction with the SiC substrate can be bonded to the activated SiC surface to form a film, which has been investigated next.

Figure 9:
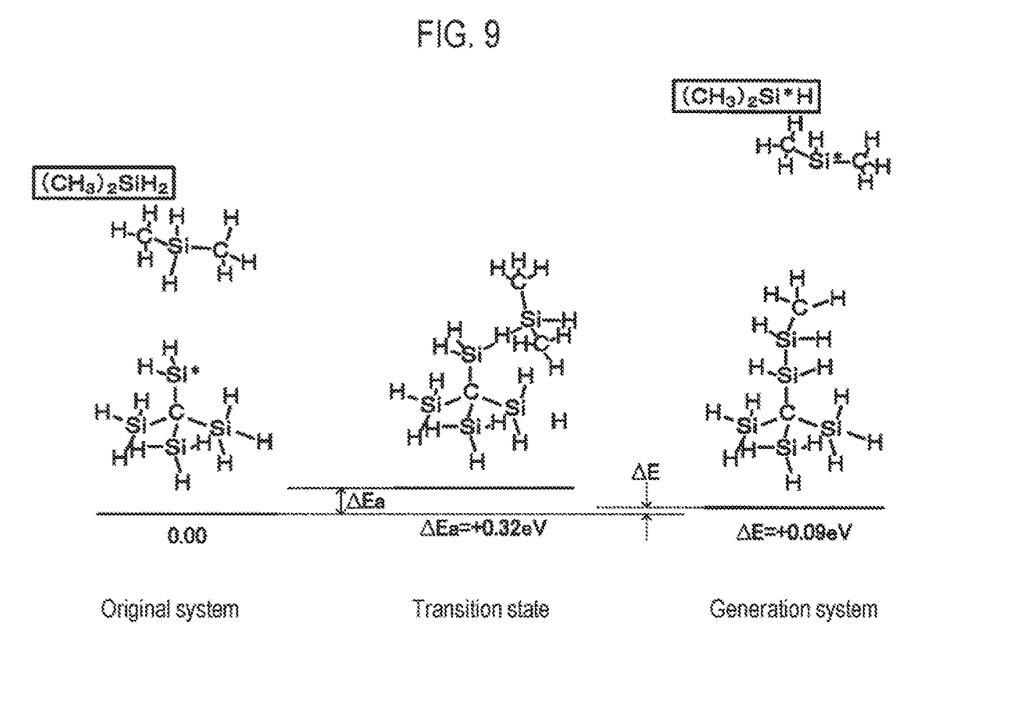
FIG. 9 is a view showing an energy required to obtain dimethylsilane radicals by activating dimethylsilane by a surface reaction with a SiC substrate.

FIG. 9 is a view for explaining an energy required to activate dimethylsilane by the surface reaction with the SiC substrate to obtain dimethylsilane radicals.

In order to obtain the dimethyl radicals as described above, it is necessary to go through a transition state as shown in the figure. The activation energy required to go to this transition state, that is, the energy required to obtain the dimethylsilane radicals by the surface reaction with the SiC substrate, is 0.32 eV. This energy is lower than 0.75 eV which is a threshold value required to obtain the surface reaction at the substrate temperature of 400 degrees C.

Therefore, it is possible to obtain dimethylsilane radicals by activating dimethylsilane by the surface reaction with the SiC substrate of 400 degrees C.

Figure 10:
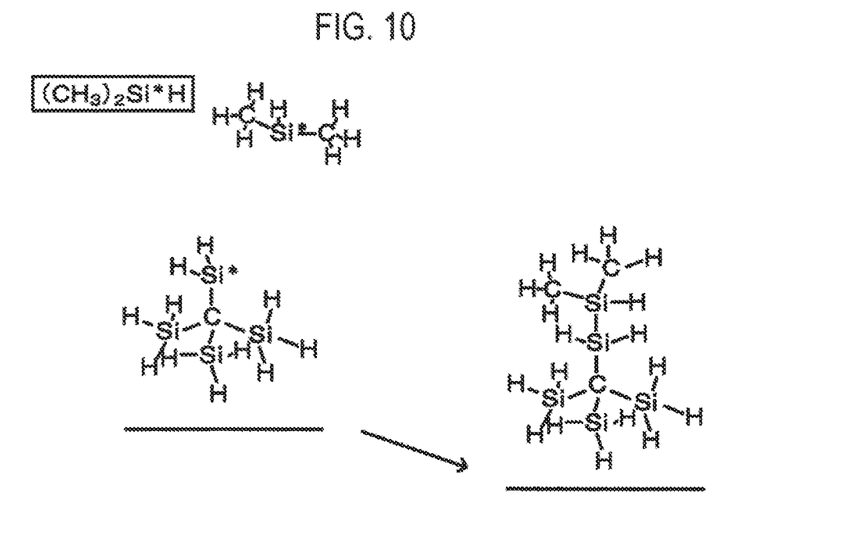
FIG. 10 is a view showing an energy required to bond methylsilane radicals to an activated SiC substrate surface.

FIG. 10 is a view for explaining an energy required to bond dimethylsilane radicals to the activated SiC substrate surface.

According to the simulation results, as shown in the figure, when the substrate temperature is 400 degrees C., the dimethylsilane radicals may be bonded to the activated SiC substrate surface.

Therefore, as described with reference to FIGS. 9 and 10, when the substrate temperature is 400 degrees C., the dimethylsilane radicals obtained by activating dimethylsilane by the surface reaction with the SiC substrate may be bonded to the activated SiC substrate surface to form a film. However, since this method consumes two active sites, it cannot be said to be an efficient film forming method.

Figure 11:
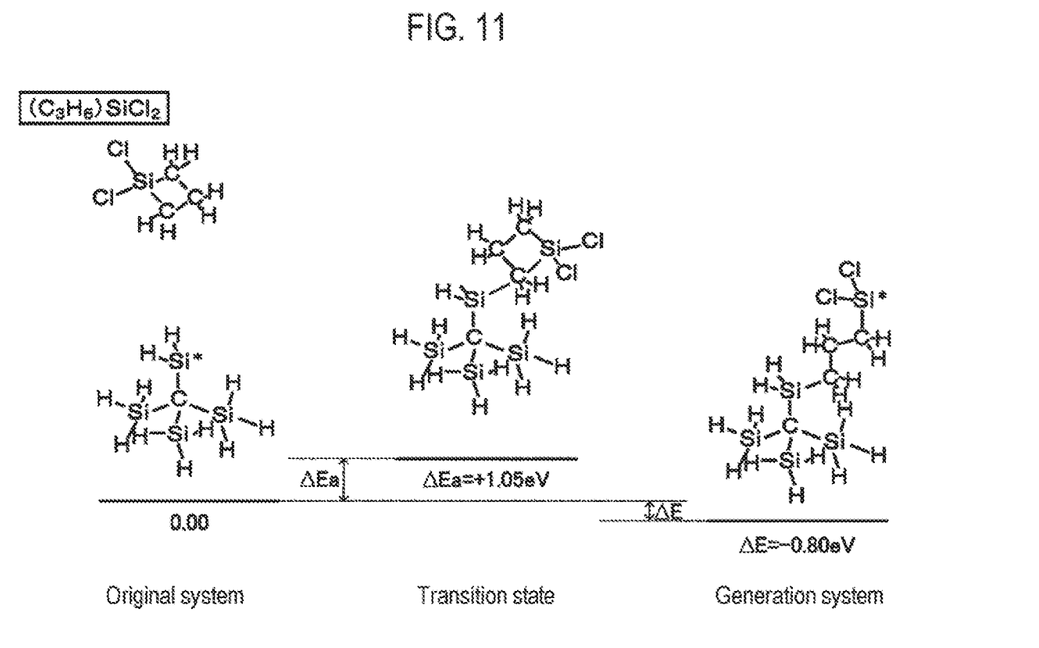
FIG. 11 is a view showing an energy required to bond a SiC-based molecule containing a many-membered ring structure as a precursor to an activated SiC substrate surface.

FIG. 11 is a view for explaining an energy required to bond a SiC-based molecule containing a many-membered ring structure as a precursor to the activated SiC substrate surface. It is necessary to go through a transition state by using $C_3H_6SiCl_2$, which is a SiC-based molecule having a 4-membered ring structure containing Si atoms and C atoms, as a precursor in order to bond/adsorb the precursor to the activated SiC substrate surface. The activation energy required to go from the original system to the transition state, that is, the energy required to bond the precursor to the SiC substrate surface, is 1.05 eV. However, this energy is higher than 0.75 eV which is a threshold value required to form a SiC film by an ALD method at the substrate temperature of 400 degrees C.

Therefore, it is considered that it is difficult to form the SiC film using $C_3H_6SiCl_2$.

It is conceivable that it is possible to bond radicals obtained by activating $C_3H_6SiCl_2$ to the activated SiC substrate surface to form a film. However, as in the case of using dimethylsilane radicals, since this method consumes two active sites, it cannot be said to be an efficient film forming method.

For a SiC-based molecule having a many-membered ring structure of three or more members, the above-described points are the same as the SiC-based molecule having the 4-membered ring structure.

Figure 12:
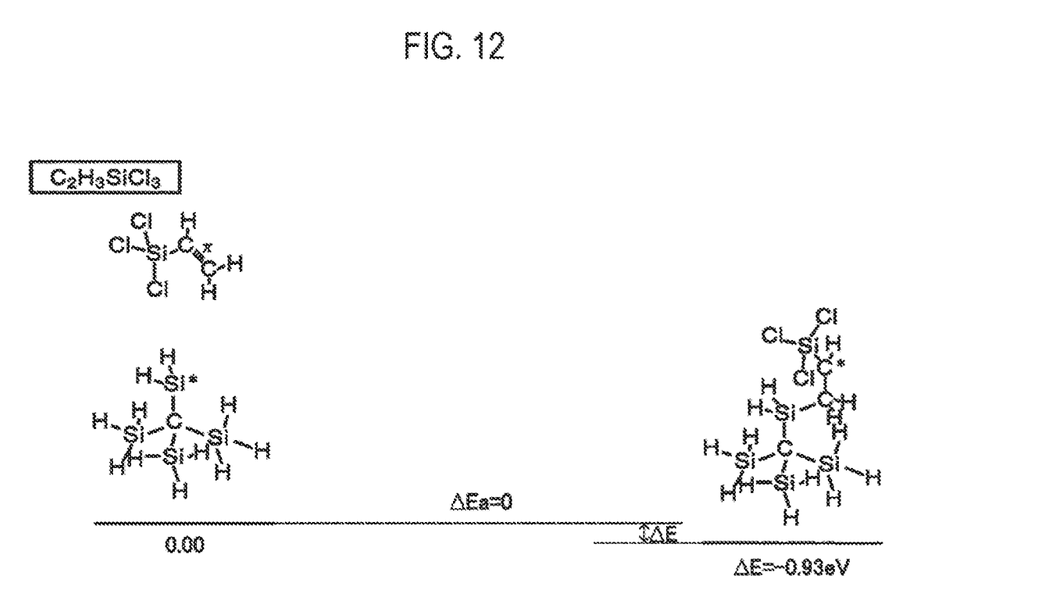
FIG. 12 is a view for explaining an energy required to bond a SiC-based molecule having a straight-chain unsaturated bond as a precursor to an activated SiC substrate surface.

FIG. 12 is a view for explaining an energy required to bond a SiC-based molecule having a straight-chain unsaturated bond as a precursor to the activated SiC substrate surface.

According to the simulation results, as shown in the figure, when the substrate temperature is 400 degrees C., vinyltrichlorosilane ($C_2H_3SiCl_3$) as a precursor may be bonded to the activated SiC substrate surface without going through a transition state.

Therefore, vinyltrichlorosilane may be used to form a SiC film on the activated SiC substrate at the low temperature of 400 degrees C.

In addition, as shown in the figure, when vinyltrichlorosilane is bonded to the activated SiC substrate surface, a carbon active site (radical site) is formed on the surface. Then, surface reconstruction occurs with low barrier energy of 0.33 eV and the radical site is replaced with a dangling bond of Si atoms on the SiC substrate surface. In other words, if there is a hydrogen-terminated Si atom which is adjacent to a Si atom bonded with vinyltrichlorosilane and is not bonded with vinyltrichlorosilane and not activated, this Si atom is activated by the radical site formed by the bonding of vinylchlorosilane. Since vinyltrichlorosilane bonds to the Si atom activated by this radical site, the bonding of vinyltrichlorosilane occurs in a chain. This chain reaction stops when the radicals meet each other and recombine with each other. As a result, a vinyltrichlorosilane monolayer film is formed on the entire surface of the SiC substrate. That is, by using vinyltrichlorosilane as a precursor, since the activated SiC substrate and the precursor are bonded to each other by a chain reaction, a SiC film may be formed rapidly.

In addition, since the surface reconstruction takes place in a short time, there is an extremely low possibility of further adsorption of vinyltrichlorosilane on the adsorbed vinyltrichlorosilane, that is, the occurrence of multilayer adsorption.

Next, the present inventors have investigated whether or not the second layer formation is limited after the formation of the SiC monolayer film on the activated SiC substrate surface using vinyltrichlorosilane as the precursor, that is, whether or not self-limiting is maintained in the case of using vinyltrichlorosilane as the precursor.

Figure 13:
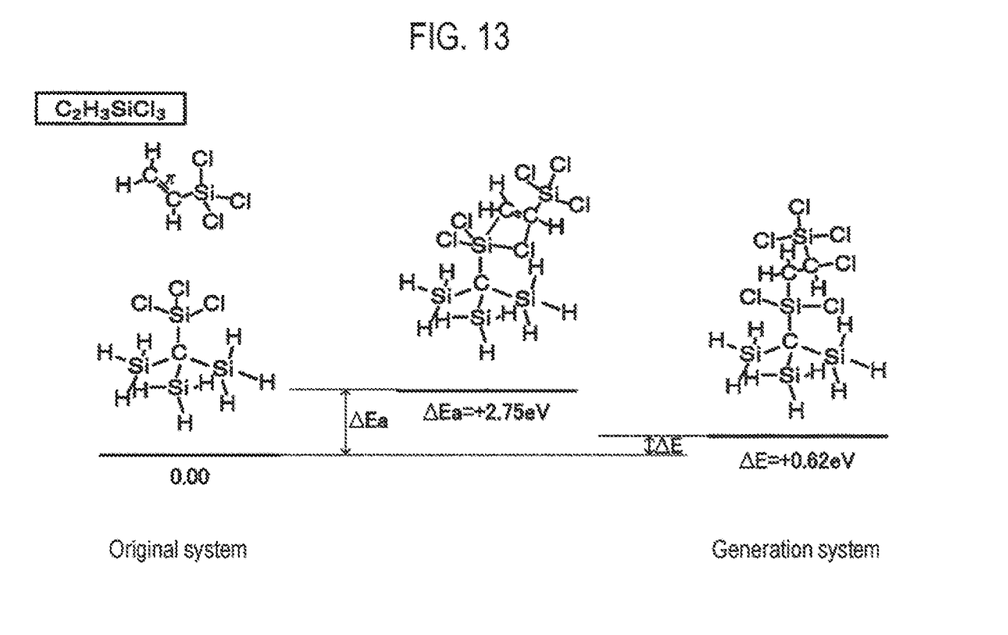
FIG. 13 is a view for explaining an energy required to bond vinyltrichlorosilane to a surface of a SiC film formed using vinyltrichlorosilane.

FIG. 13 is a view for explaining an energy required to bond vinyltrichlorosilane to the surface of the SiC film formed using vinyltrichlorosilane.

In a simulation for calculating the required energy, the surface of the SiC film formed using vinyltrichlorosilane is represented by a structure (CSi—Cl structure) where Si atoms bonded to a C atom are terminated with Cl (chlorine) atoms, as shown in the figure.

It is necessary to go through a transition state in order to bond/adsorb vinyltrichlorosilane as a precursor to the surface (hereinafter referred to as a CSi—Cl structure surface) of the SiC film formed using vinyltrichlorosilane. The activation energy required to go from the original system to the transition state, that is, the energy required to bond the precursor to the CSi—Cl structure surface, is 2.75 eV. However, this energy is much higher than 0.75 eV which is a threshold value required to obtain the surface reaction at the substrate temperature of 400 degrees C.

Therefore, vinyltrichlorosilane can be used as a precursor to maintain the self-limiting.

The present inventors have also investigated whether or not the surface of the SiC film formed on the activated surface of the SiC substrate by using vinyltrichlorosilane as the precursor can be activated.

Figure 14:
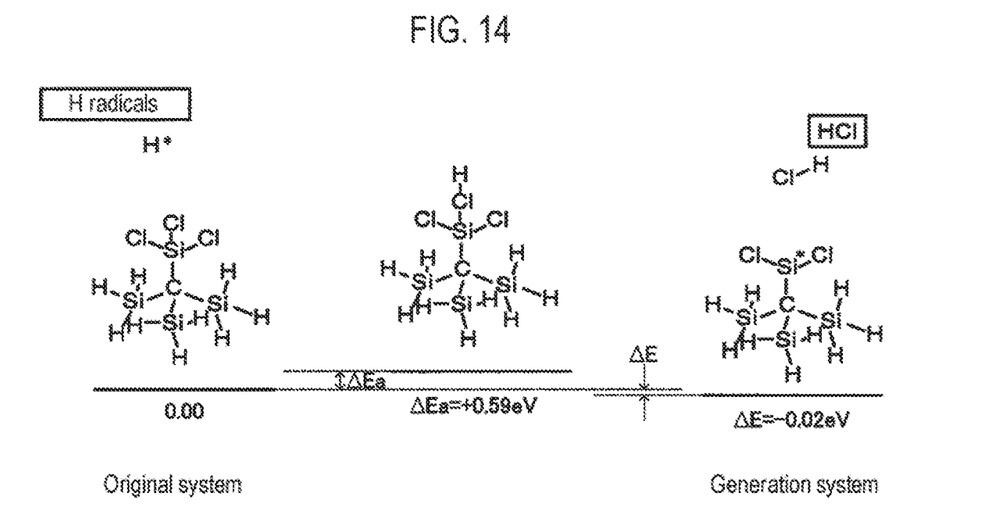
FIG. 14 is a view showing an energy required to activate a surface of a SiC film formed using vinyltrichlorosilane.

FIG. 14 is a view showing an energy required to activate the surface of the SiC film formed by using vinyltrichlorosilane.

As shown in the figure, it is necessary to go through a transition state in order to activate the CSi—Cl structure surface by using plasma of H radicals, specifically, in order to cleave the bonding between Si atoms and Cl atoms surface-terminated with the Si atoms. The activation energy required to go to this transition state, that is, the energy required to activate the CSi—Cl structure surface with the H radical plasma, is 0.59 eV. This energy is lower than 0.75 eV which is a threshold value required to obtain the surface reaction at the substrate temperature of 400 degrees C.

Therefore, it is possible to activate the CSi—Cl structure surface by using the H radical plasma at the substrate temperature of 400 degrees C. Accordingly, by activating the substrate surface by the H radical plasma and forming a SiC film using vinyltrichlorosilane as a precursor, the SiC film may be multilayered to have a desired film thickness as necessary.

From the above findings, in the present embodiment, (1) the surface of the substrate W is activated by plasma of H radicals, and (2) a vinyltrichlorosilane gas as a source gas is supplied onto the substrate W whose surface is activated. As a result, a SiC film may be formed on the surface of the substrate W even at a low substrate temperature.

In addition, the activation of the surface of the substrate W may be carried out by plasma of Ar, He (helium) or $N_2$ instead of the H radical plasma.

Further, the precursor may be vinylsilane instead of vinyltrichlorosilane. Furthermore, the precursor is not limited to these but may be any precursor represented by the chemical formula $RSiX^1_3$ or $RSiHClX^2$. In the formula, R is an organic group having a straight-chain unsaturated bond, $X^1$ is selected from a group consisting of H, F, Cl, Br and I, and $X^2$ is selected from a group consisting of Cl, Br and I.

The above description is for a SiC film, but the film forming method of this embodiment can also be applied to formation of other carbonized films such as a GeC film, a GeSiC film and the like.

As an ALD precursor of the GeC film or the GeSiC film, one consisting of a chain organic compound having an unsaturated bond different from that of the SiC film may be used. For example, as the ALD precursor of the GeC film, one represented by the chemical formula $RGeX^1_3$ or $RGeHClX^2$ may be used. In the formula, R is an organic group having a straight-chain unsaturated bond, $X^1$ is selected from a group consisting of H, F, Cl, Br and I, and $X^2$ is selected from a group consisting of Cl, Br and I. As the ALD precursor of the GeSiC film, for example, one represented by the chemical formula $RSiX^1_2GeX^2_3$ or $RGeX^1_2SiX^2_3$ may be used. In the formula, R is an organic group having a straight-chain unsaturated bond, and $X^1$ and $X^2$ are selected from a group consisting of H, F, Cl, Br and I.

Second Embodiment

Figure 15:
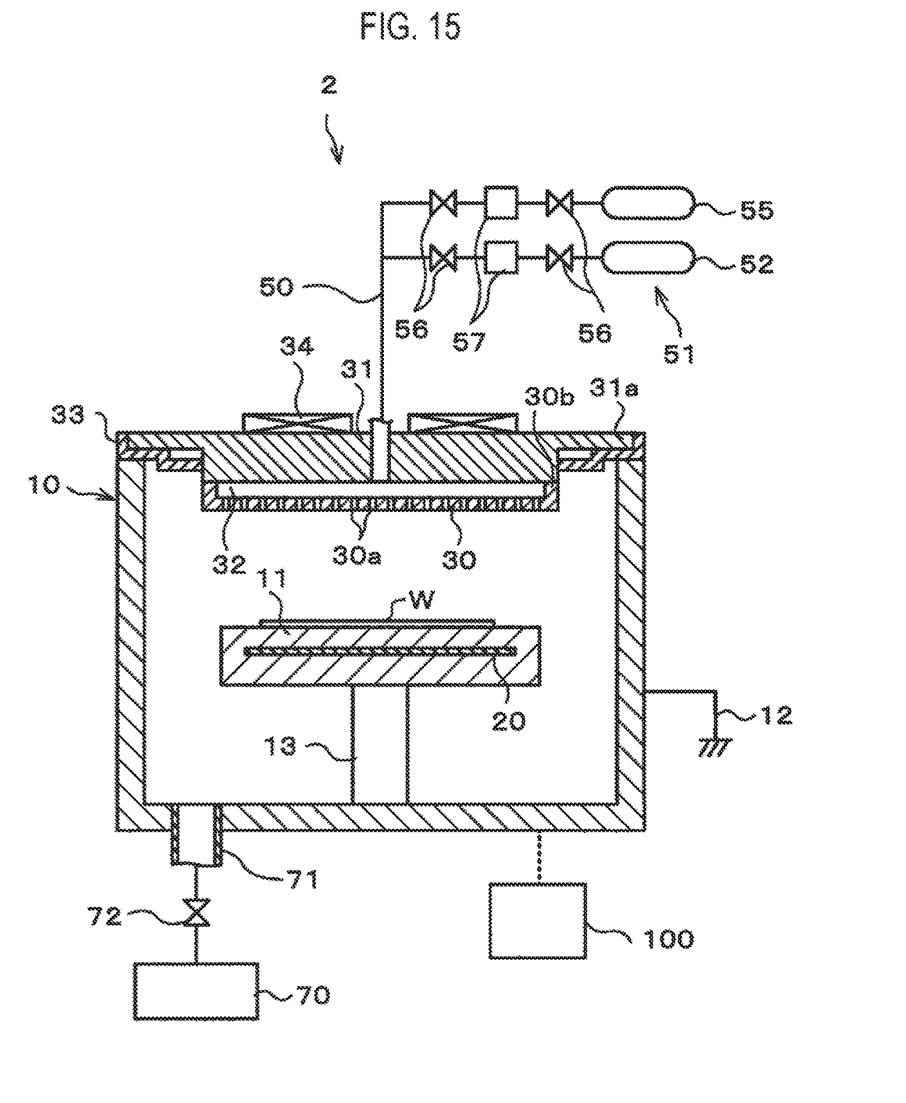
FIG. 15 is a longitudinal sectional view schematically showing a film forming apparatus according to a second embodiment of the present disclosure.

FIG. 15 is a longitudinal sectional view schematically showing a film forming apparatus according to a second embodiment of the present disclosure.

The film forming apparatus 2 shown in the figure forms a SiC film on a substrate W by a thermal CVD method.

A mounting table 11 of the film forming apparatus 2 is substantially the same as the mounting table 11 of FIG. 1, but it does not need to form a lower electrode since it does not generate plasma, so that it may not be grounded.

A processing container 10 of the film forming apparatus 2 is substantially the same as the processing container 10 of FIG. 1, but since it does not generate plasma, a member denoted by reference numeral 30 does not function as an upper electrode and functions only as a shower plate. In addition, since it is not necessary to insulate a lid 31 from the ground portion, a support member 33 does not have to be made of an insulating material. Further, if it is not necessary to heat a source gas, an electric heater 34 may not be provided. Unlike one shown in FIG. 1, a high frequency power supply 60 and the like are not connected to the lid 31.

A process gas supply source 51 of the film forming apparatus 2 includes a source gas supply part 52 for supplying a source gas for forming a SiC film, for example, a gas containing $C_2H_4SiH_2$ having a 3-membered ring formed by C atoms and Si atoms as a precursor, and a purge gas supply part 55 for supplying a $N_2$ gas for purging. The process gas supply source 51 further includes valves 56 and flow rate regulation mechanisms 57 which are respectively provided between each of the gas supply parts 52 and 55 and a gas diffusion chamber 32. The flow rates of gases supplied into the gas diffusion chamber 32 are controlled by the respective flow rate regulation mechanisms 57.

In a film forming process in the film forming apparatus 2, first, the substrate W is loaded into the processing container 10 and is mounted and held on the mounting table 11. When the substrate W is held on the mounting table 11, the interior of the processing container 10 is exhausted and kept airtight by an exhaust mechanism 70. At the same time, a $C_2H_4SiH_2$ gas and a $N_2$ gas are supplied from the process gas supply source 51 into the processing container 10 at their respective predetermined flow rates. At this time, the flow rate regulation mechanisms 57 are controlled such that the flow rate of the $C_2H_4SiH_2$ gas becomes about 1 to 100 sccm and the flow rate of the $N_2$ gas becomes about 1 to 10,000 sccm. Further, the opening degree of a regulating valve 72 is controlled such that the internal pressure of the processing container 10 becomes, for example, 13 to 1,330 Pa.

At the same time, the substrate W on the mounting table 11 is heated and maintained at 400 degrees C., for example, by the electric heater 20 or the like. Next, high frequency power is applied to the upper electrode 30 by the high frequency power supply 60. As a result, a SiC film is formed on the surface of the substrate W.

Upon completion of the film forming process on the substrate W, the substrate W is unloaded from the processing container 10. Then, a new substrate W is loaded into the processing container 10 and the film forming process on this series of substrates W is repeatedly performed.

As described above, in this embodiment, a $C_2H_4SiH_2$ gas having a 3-membered ring as a source gas is supplied onto the substrate W and a SiC film is formed by a thermal CVD method on the substrate W heated to 400 degrees C. This method is based on the findings by simulation analysis performed by the present inventors.

Figure 16A:
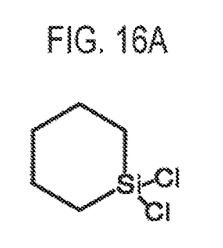
FIGS. 16A to 16C are views showing a structure of a SiC-based molecule containing a many-membered ring structure, which is considered to be used as a precursor in the second embodiment of the present disclosure.
Figure 16B:
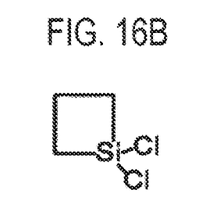
Figure 16C:
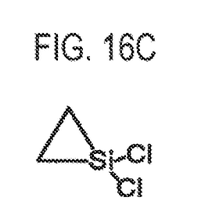

The present inventors have investigated a SiC-based molecule containing a straight-chain unsaturated bond, a SiC-based molecule containing a many-membered ring structure, and a normal straight-chain SiC-based molecule containing neither unsaturated bond nor many-membered ring structures, as a precursor used in this embodiment. FIGS. 16A to 16C are views showing the structure of a SiC-based molecule containing a many-membered ring structure, which is considered to be used as a precursor in this embodiment.

Using diethylsilane or dimethylsilane which is the normal straight-chain SiC-based molecule containing neither unsaturated bond nor many-membered ring structures, as a precursor, in order to deposit these molecules on the substrate by a CVD method, it is necessary to desorb two $H_2$ atoms bonded to a Si atom as a hydrogen molecule ($H_2$). For this desorption, 2.78 eV and 2.81 eV are required for diethylsilane and dimethylsilane, respectively. However, these energies are higher than 1.74 eV which is a threshold value required to form the SiC film by the CVD method at the substrate temperature of 400 degrees C.

Therefore, it is difficult to form a SiC film by a CVD method using diethylsilane or dimethylsilane as a precursor.

Using vinyltrichlorosilane, $CH_2$=CH—CH=CH—$SiCl_3$ or ethynyltrichlorosilane which is the SiC-based molecule containing a straight-chain unsaturated bond, as a precursor, in order to deposit these molecules on the substrate by a CVD method, it is necessary to cleave the unsaturated bond. For this cleavage, 2.47 eV and 2.12 eV are required for vinyltrichlorosilane, $CH_2$=CH—CH=CH—$SiCl_3$ and ethynyltrichlorosilane, respectively. However, these energies are higher than 1.74 eV which is a threshold value required to form the SiC film by the CVD method at the substrate temperature of 400 degrees C.

Therefore, it is difficult to form a SiC film by a CVD method using vinyltrichlorosilane, $CH_2$=CH—CH=CH—$SiCl_3$ or ethynyltrichlorosilane as a precursor.

Further, using molecules having the structure of FIGS. 16A to 16C, which is the SiC-based molecules containing a many-membered ring formed by C atoms and Si atoms, as a precursor, in order to deposit these molecules on the substrate by a CVD method, it is necessary to cleave the bonding between C atoms of each molecule or the bonding between Si atoms and C atoms of each molecule.

For a molecule ($C_5H_{10}SiCl_2$) having a 6-membered ring structure of FIG. 16A, an energy of 3.40 to 3.49 eV is required to cleave the bonding between C atoms or the bonding between Si atoms and C atoms.

For a molecule ($C_3H_6SiCl_2$) having a 4-membered ring structure of FIG. 16B, energies of 2.41 and 2.56 eV are respectively required to cleave the bonding between C atoms and the bonding between Si atoms and C atoms.

For a molecule ($C_2H_4SiCl_2$) having a 3-membered ring structure of FIG. 16C, energies of 1.46 and 1.49 eV are respectively required to cleave the bonding between C atoms and the bonding between Si atoms and C atoms.

The threshold value required to form the SiC film by the CVD method at the substrate temperature of 400 degrees C. is 1.74 eV.

Therefore, it is difficult to form a SiC film using a molecule having the structure of FIGS. 16A and 16B as a precursor, but it is possible to form a SiC film by a thermal CVD method on the SiC substrate even at the low temperature of 400 degrees C. by using a molecule ($C_2H_4SiCl_2$) having the 3-membered ring structure of FIG. 16C as a precursor.

From the above findings, in the present embodiment, a gas of $C_2H_4SiH_2$ having the 3-membered ring formed by C atoms and Si atoms is supplied onto the substrate W and a SiC film is formed by a thermal CVD method on the substrate W heated to 400 degrees C.

The precursor is not limited to $C_2H_4SiH_2$ but may be one represented by the chemical formula $C_2H_4SiX_2$ or $CH_2Si_2X_4$. In the formula, X is selected from a group consisting of H, F, Cl, Br and I.

The above description is for a SiC film, but the film forming method of this embodiment can also be applied to formation of other carbonized films such as a GeC film, a GeSiC film and the like.

As a CVD precursor of the GeC film or the GeSiC film, one consisting of an organic compound having a 3-membered ring different from that of the SiC film may be used. For example, as the CVD precursor of the GeSiC film, an organic compound having a 3-membered ring formed by C atoms and Ge atoms, for example, one represented by the chemical formula $C_2H_4SiX_2$ or $CH_2Si_2X_4$, may be used. In the formula, X is selected from a group consisting of H, F, Cl, Br and I.

As the CVD precursor of the GeSiC film, an organic compound having a 3-membered ring formed by C atoms and Si atoms or Ge atoms, for example, one represented by the chemical formula $C_2H_4SiX^1_2GeX^2_2$, may be used. In the formula, $X^1$ and $X^2$ are selected from a group consisting of H, F, Cl, Br and I.

The above embodiments can be applied to not only a case where a flat SiC film is formed on a SiC monolayer film formed on a flat underlying film but also a case where a SiC film is buried on a SiC monolayer film formed on an underlying film having a trench or a hole.

Further, the flat SiC film can be used for various purposes such as an etching stopper and an antireflective film.

INDUSTRIAL USE OF THE PRESENT DISCLOSURE

The present disclosure can be applied to a substrate processing apparatus that performs a film forming process on a substrate surface.

EXPLANATION OF REFERENCE NUMERALS

1, 2: film forming apparatus, 10: processing container, 11: mounting table, 20: electric heater, 30: upper electrode, 30a: gas supply hole, 50: gas supply pipe, 51: process gas supply source, 52: precursor gas supply part, 53: activation gas supply part, 60: high frequency power supply

What is claimed is:

1. A method for forming a SiC film on a target substrate by thermal CVD (Chemical Vapor Deposition), comprising:

forming the SiC film by supplying a source gas, which contains a precursor having a 3-membered ring formed by at least one C atom and at least one Si atom, onto the target substrate.

2. The method of claim 1, wherein the precursor is represented by a chemical formula $C_2H_4SiX_2$ or $CH_2Si_2X_4$, and wherein, in the chemical formula, X is selected from a group consisting of H, F, Cl, Br and I.

* * * * *